(12) United States Patent
Mu et al.

(10) Patent No.: US 10,528,273 B2
(45) Date of Patent: Jan. 7, 2020

(54) DYNAMIC COMPRESSION IN AN ELECTRICALLY ERASABLE PROGRAMMBLE READ ONLY MEMORY (EEPROM) EMULATION SYSTEM

(71) Applicant: NXP USA, INC., Austin, TX (US)

(72) Inventors: Fuchen Mu, Austin, TX (US); Botang Shao, Austin, TX (US)

(73) Assignee: NXP USA, Inc., Austin, TX (US)

( * ) Notice: Subject to any disclaimer, the term of this patent is extended or adjusted under 35 U.S.C. 154(b) by 247 days.

(21) Appl. No.: 15/805,254

(22) Filed: Nov. 7, 2017

(65) Prior Publication Data
US 2019/0138228 A1 May 9, 2019

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC .... G06F 3/0619; G06F 3/0679; G06F 3/0653; G11C 16/3427; G11C 16/10; H03M 7/30
See application file for complete search history.

(56) References Cited

U.S. PATENT DOCUMENTS

| | | | |
|---|---|---|---|
| 8,886,991 B2* | 11/2014 | Zhang | G06F 11/008 714/47.3 |
| 2010/0325351 A1 | 12/2010 | Bennett | |
| 2011/0271035 A1 | 11/2011 | Scouller et al. | |
| 2016/0077906 A1* | 3/2016 | Scouller | G06F 11/073 714/33 |
| 2017/0052859 A1* | 2/2017 | Scouller | G06F 12/0246 |

\* cited by examiner

*Primary Examiner* — Francisco A Grullon

(57) ABSTRACT

An electrically erasable programmable read only memory (EEPROM) emulation (EEE) system includes a non-volatile memory arranged to have a plurality of sectors in which each sector is arranged to have a plurality of record locations. A new record of new data is programmed into a record location of an active sector of the plurality of sectors. After successfully completing the programming of the new record, a number of failure-to-program (FTP) occurrences during the programming is compared to a first threshold. When the number of FTP occurrences is greater than the first threshold, a determination is made as to whether compression is needed, and in response to determining that compression is needed, the method includes selectively performing compression based on a second threshold.

20 Claims, 4 Drawing Sheets

DYNAMIC COMPRESSION IN AN ELECTRICALLY ERASABLE PROGRAMMBLE READ ONLY MEMORY (EEPROM) EMULATION SYSTEM

BACKGROUND

Field

This disclosure relates generally to electrically erasable programmable read only memory (EEPROM) emulation (EEE) system and more specifically to dynamic compression in EEE system.

Related Art

An EEPROM (electrically erasable programmable read only memory) emulation (EEE) system is a type of non-volatile memory (NVM) that provides byte and/or word program and erase capability using a non-EEPROM type memory. For example, a volatile random access memory (RAM) may be used together with an NVM (e.g. flash memory) to provide the EEE system.

In current EEE system technology, for each EEE write, which includes compression or erase and a new data write (in which one new NVM record is programmed into the flash), prior to the EEE write of new data, a check is made to determine if a compression or erase is needed. If either a compression or erase is needed, the compression or erase is performed first, and afterwards, a new NVM record with new data is written. During compression, a copy of valid records is made to an active sector. As program/erase cycling increases, failure-to-program (FTP) occurrences also increase, due to mechanisms commonly referred to as trap-up and program disturb. The increase in FTP occurrences increases the time of doing a EEE write, thus decreasing the EEE performance and potentially exceeding the specification (spec) time for a EEE write. Since the compression is done prior to writing a new record with new data, if the spec time is exceeded during compression, a failure results because there is not enough time in the spec time left to perform the write of a new record into the active sector. Therefore, a need exists to improve the performance of a EEE system by ensuring that creating a new record with new data does not exceed spec time for a EE write, even as the program/erase cycle counts increase.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Dynamic compression may be used to improve performance of a EEE system by reducing failures through reduced writes and thus extending the product lifetime. With dynamic compression, even if compression is determined to be needed, compression may or may not occur, as determined dynamically by different factors. In one embodiment, based on the number of FTPs, compression can be selectively omitted. For example, if the number of ready sectors in the EEE system is sufficient, compression can be omitted. Also, if the FTP count is sufficient low, a compression can be aborted under certain conditions. By omitting or aborting compressions, when possible, the number of failures can be reduced, thereby improving performance and extending product lifetime. Also, in either situation, the determination of whether or not a compression is needed (whether completed, omitted, or aborted) is performed after successfully programming a new record with new data in the active sector. In this manner, new EEE write data is not lost and EEE write time can be better controlled.

Figure 1:
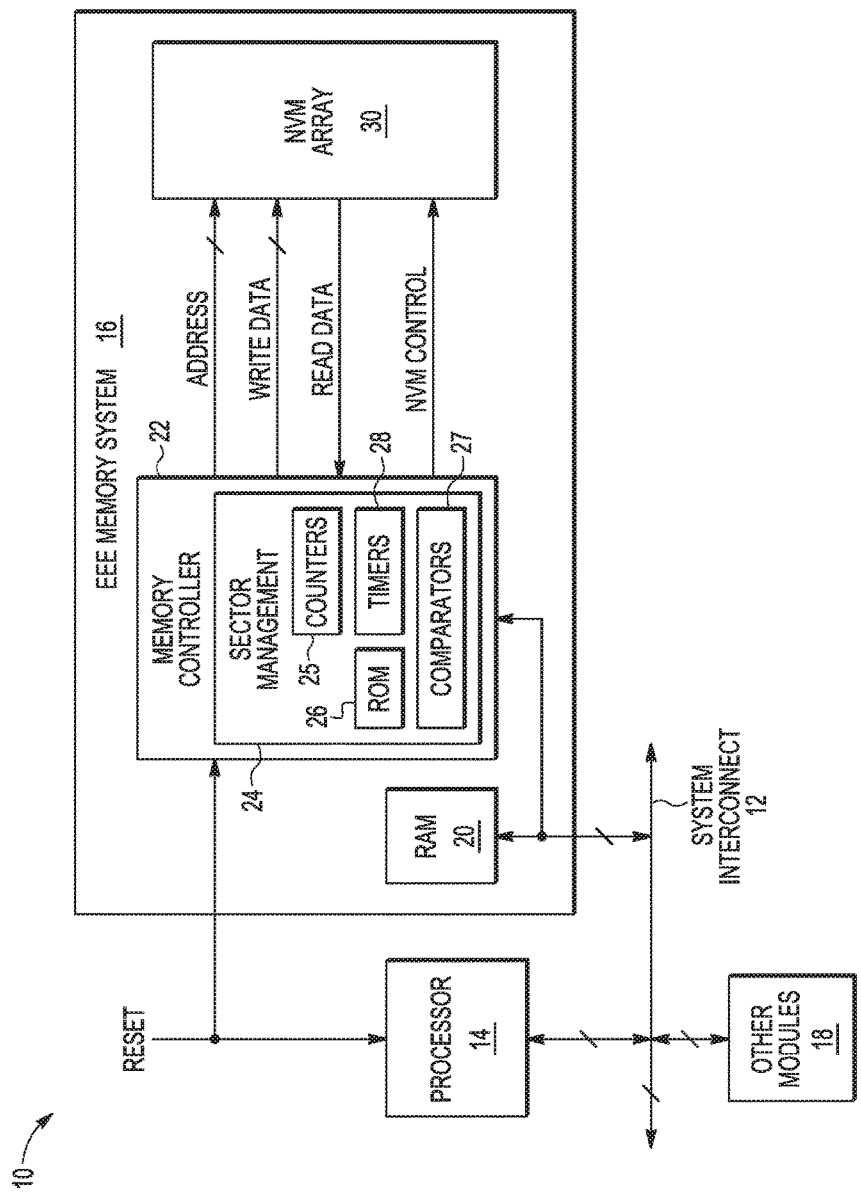
FIG. 1 illustrates a block diagram of a data processing system in accordance with an embodiment of the present invention.

FIG. 1 illustrates a block diagram of data processing system 10 in accordance with an embodiment. Data processing system 10 includes system interconnect 12, processor 14, electrically erasable programmable read only memory (EEPROM) emulator (EEE) system 16, and other module(s) 18. Each of processor 14, EEE memory system 16, and other module(s) 18 are bi-directionally coupled to system interconnect 12. System interconnect 12 may be any type of system for interconnecting the various portions of data processing system 10, such as a system bus, a crossbar switch, point-to-point connections, optical, and wireless transmission techniques. EEE memory system 16 includes random access memory (RAM) 20, memory controller 22, and non-volatile memory (NVM) array 30. NVM array 30 may be a flash array or any other type of NVM array formed using a semiconductor substrate. Memory controller 22 includes sector management circuitry 24. Sector management circuitry 24 includes a Read Only Memory (ROM) 26, configured to store various static values, a set of timers 28, a set of counters 25, and comparators 27. ROM 26 can also be implemented with other types of storage circuitries or memories, such as flash. ROM 26, timers 28, counters 25, and comparators 27 may also reside elsewhere in memory controller 22, outside of sector management circuitry 22. The values in ROM 26 can also be stored elsewhere in data processing system 10. A reset signal is provided to processor 14 and memory controller 22. This reset signal may be, for example, a global reset signal for data processing system 10.

RAM 20 may be a volatile memory such as a static random access memory (SRAM) or a dynamic random access memory (DRAM). RAM 20 is bidirectionally coupled to system interconnect 12 and to memory controller 22. Memory controller 22 is coupled to system interconnect 12 and NVM array 30. Sector management circuitry 24 is coupled to NVM array 30. Memory controller 22 is configured to communicate with NVM array 30 with signals including address signals ADDRESS, program data signals WRITE DATA, read data signals READ DATA, and NVM control signals NVM CONTROL.

Processor 14 can be any type of processor or processor core, such as a microprocessor, microcontroller, digital signal processor (DSP), and the like, or may be any other type of interconnect master that can access EEE system 16. Other modules 18 may include any type of module or circuit, such as, for example, another memory, another processor, another interconnect master, a peripheral, an input/output (I/O) device, and the like. Alternatively, there may not be any other modules present in data processing system 10.

In operation, processor 14 can send access requests (read, write, or program access requests) to EEE memory system 16. The access requests from processor 14, which include an access address and, in the case of a write or program access, associated write data, are provided to RAM 20. In the case of a read access, RAM 20 provides to processor 14 the data stored at the received access address location. In the case of a write access, RAM 20 stores the received write data at the received access address location. Further in the case of a write access, memory controller 22 may detect such an update of RAM 20 and selectively store the received access address and associated write data to an active sector of NVM array 30 in a logically sequential manner. For example, in the case of an update (a write) to RAM 20, the received access address and associated write data are used to form a record that is programmed in NVM array 30 at the next available record or data location (referred to as an EEE write). This next available record location is logically sequential to a record location that was loaded during an immediately preceding loading of NVM array 30. In one example, the writing of the record corresponding to the RAM update is only performed (or stored in NVM array 30) if the value that is currently stored at the RAM location is different from the new write value associated with the write access request for that RAM 20 location. In this manner, NVM array 30 can store the updated values of RAM 20 in a more permanent manner. That is, when RAM 20 loses power, its data is lost. Upon restoring power, the values of RAM 20 may be restored (e.g., read) from NVM array 30, which does not lose its data upon losing power. In one embodiment, NVM array 30 has a greater storage capacity than RAM 20. For example, NVM array 30 may have a capacity at least four times greater than RAM 20 and typically much larger than that.

Figure 2:
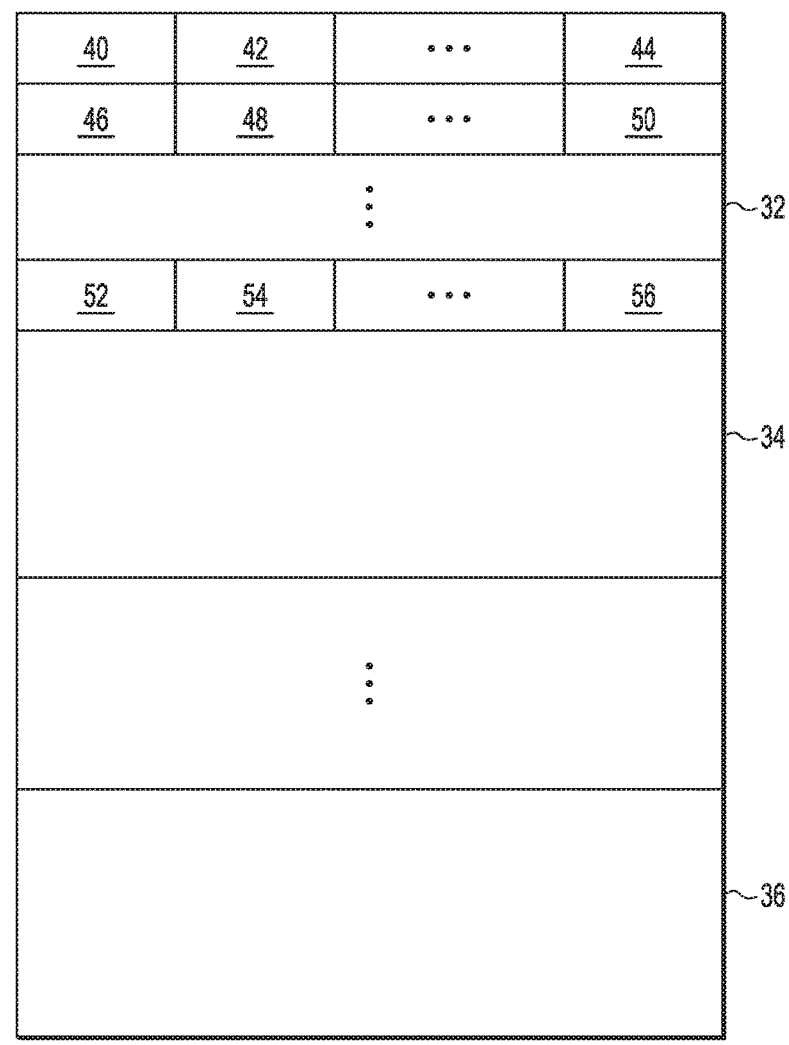
FIG. 2 illustrates the non-volatile memory array of FIG. 1 in more detail.

FIG. 2 illustrates an embodiment of NVM array 30 of FIG. 1 in more detail. Non-volatile memory array 30 is arranged as a plurality of sectors represented by sectors 32, 34, and 36. Each of sectors 32, 34, and 36 are arranged into a plurality of record locations represented in FIG. 2 by record locations 40, 42, 44, 46, 48, 50, 52, 54, and 56 in sector 32.

Non-volatile memory array 30 has a limited number of program/erase cycles before operation becomes unreliable. One way to increase the life of NVM array 30 is to include a large memory array arranged in sectors, where each sector corresponds in capacity to the capacity of RAM 20. Memory controller 22 controls which sector is active for programming operations. Only one sector may be active at a time. Therefore, an active sector is the sector in which records are currently being written. When a current active sector is full, a new active sector will be selected among the ready sectors. A ready sector is a sector that is empty and ready to be used. That is, it is fully compressed and erased. In one embodiment, each sector stores a status indicator which indicates if the sector is in a full state (meaning there are no more available record locations in the sector and the sector is ready for compression), a compression state (meaning the sector is in the process of being compressed), an erase state (meaning the sector is in the process of being erased), and a ready state (meaning the sector is empty and ready to be used).

Generally, a record is a location which is programmed with data using a conventional programming process using a number of programming pulses interleaved with verify operations. In one embodiment, the record may be programmed with an encryption/decryption key. As the number of program and erase operations increases, the likelihood that a programming operation will fail increases. A common fail mode occurs after a program finishes when one or more bitcells of the sector fail margin reads for the bits that should stay erased after the program operation. That is, a failure occurs when erased bits do not remain erased due to, for example, program disturb. This type of failure occurs more often as the program/erase cycles increase since program disturb gets worse due to trap-up. In one embodiment, an FTP counter within counters 25 keeps a record of the number of FTPs for each sector.

To perform compression of a sector, checks are performed on the to-be-compressed sector in which invalid data is ignored and a certain number (N) of valid records are copied to the active sector. In the examples described herein, N is assumed to be 2, such that for one compression operation, 2 valid records are copied from the to-be-compressed sector to the active sector. Also, in one embodiment, N may be stored in ROM 26. To erase a sector, a Fowler-Nordheim (FM) erase is performed on all the bitcells of the to-be-erased sector by applying an erase pulse to the sector to erase the bitcells.

Figure 3:
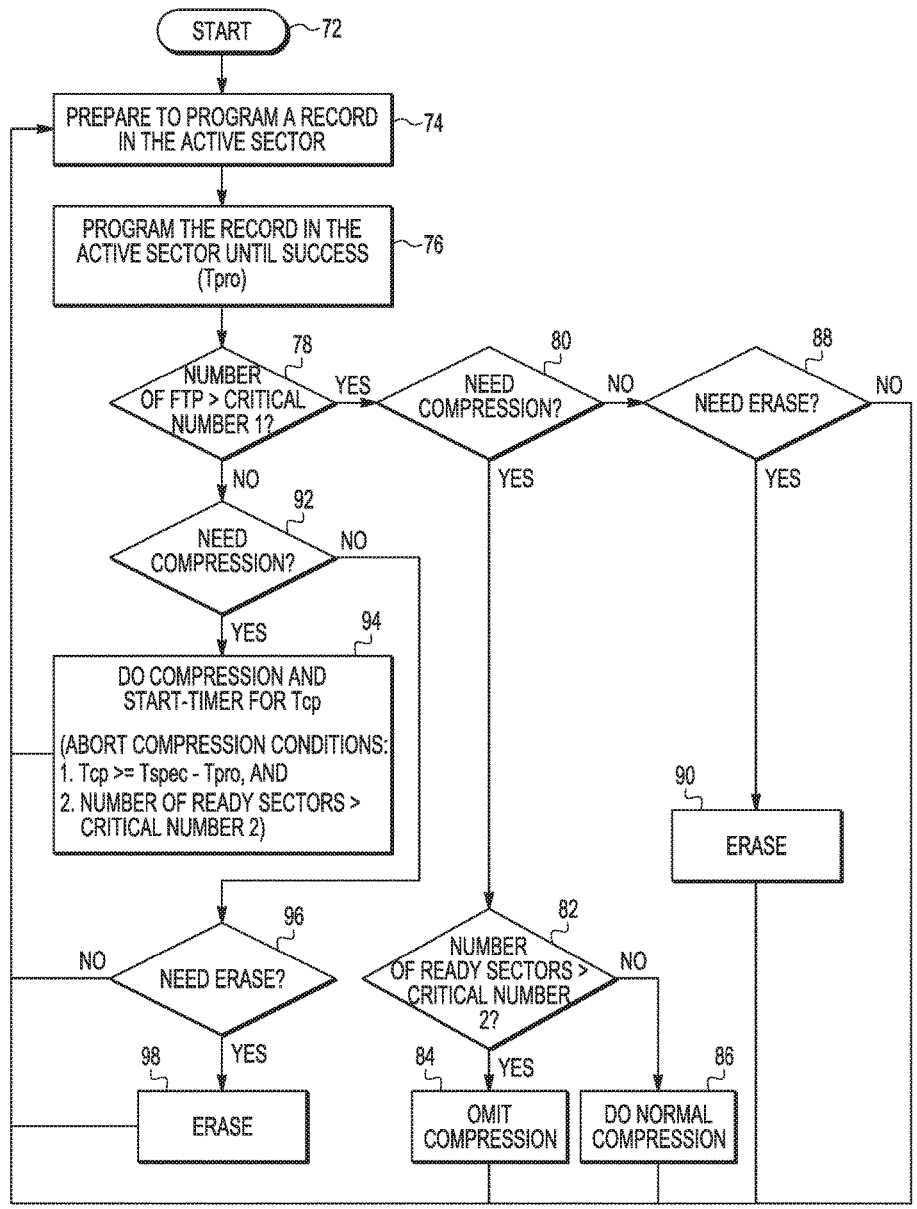
FIGS. 3 and 4 illustrate flowcharts of a method for dynamic compression in accordance with embodiments of the present invention.

FIG. 3 illustrates a method 70 for performing dynamic compression in EEE system 16, in accordance with one embodiment of the present invention. Method 70 begins with start 72 and proceeds to block 76 in which EEE system 16 prepares to program a new record of new data into the active sector of NVM 30 in response to an EEE write command. This preparation may include, for example, initialization of counters 25 and timers 28, and a command check and address/data check of the data being prepared for programming provided by the EEE write command. Method 70 proceeds to block 76 in which the new record is programmed into a record location of the active sector (indicated by sector management circuitry 24) until successfully programmed. Also, a program duration timer, Tpro, of timers 28 is enabled which indicates the time consumed to write the new EEE data to the active sector of NVM 30. Due to trap-up, programming to one NVM address might fail, causing an FTP. In that case, the FTP counter of counters 25 is incremented, and programming to the next address of NVM 30 in the active sector is sequentially tried until the record is programmed to one address successfully (increasing the FTP counter with each FTP that occurs). The programming of the address in NVM 30 is successful if the programmed bits passed a program verify step and the bits that should stay erased passed an erase margin read step. Once programming is successful, the Tpro timer is stopped and thus indicates the time it took to write the new EEE data to NVM 30.

After successful programming, method 70 continues to decision diamond 92 in which the number of FTPs, as indicated by the FTP counter, is compared with a critical number 1 which indicates the maximum number of FTPs allowed before compression. That is, if the FTP count is higher than critical number 1, compression can be omitted if there are enough ready sectors for the EEE update. Therefore, if the FTP count is greater than critical number 1, method 70 proceeds to decision diamond 80 to determine if compression is needed. In one embodiment, this determination is made based on the oldest full sector of NVM 30. In the oldest full sector (in which all record locations are used), a scan is performed to determine if there are any valid records, and if so, it is determined that compression of that oldest full sector (referred to as the to-be-compressed sector) would be desirable. Method 70 proceeds to diamond 82 in which compression is dynamically performed on the to-be-compressed sector based on a critical number 2, which indicates a critical number of ready sectors in NVM 30. If the number of ready sectors in NVM 30 is not greater than critical number 2, then normal compression is performed, and if the number of ready sectors is greater than critical number 2, then compression is omitted. That is, compression is started and allowed to finish only if the number of ready sectors is not greater than critical number 2, which indicates that there are not enough ready sectors available for the following EEE writes (i.e. that NVM 30 may run out of ready sectors soon) and thus more space in NVM 30 needs to be freed up. In this case, more time is spent creating space by performing normal compression (block 86) even though it may cost more time to do the current EEE write operation. However, the option exists to omit compression and save time for an EEE write operation if the number of FTPs is greater than critical number 1 and the number of ready sectors is greater than critical number 2.

If, at decision diamond 80, compression is determined to not be needed (e.g. because the oldest full section has no more valid records), method 70 proceeds to decision diamond 88 to determine if an erase is needed. In one embodiment, this determination is made based on the compression state of the oldest full sector. If the oldest full sector has already been compressed (i.e. it contains no more valid data to compress), then an erase is needed. Method 70 proceeds to block 90 in which an erase operation is performed. Since an erase operation is just one erase pulse, the time of an erase operation is predictable. Therefore, an erase operation, which is significant in creating available NVM space, is always done if needed. That is, when the FTP count is greater than critical number 1, the compression is performed dynamically if needed, but the erase is always performed if needed. Compression involves the writing of multiple (N) valid records to an active sector, the time of which is unpredictable in that it might create FTPs (thus increasing the probability of having an FTP by N times), while erase time is predictable. Therefore, the ability to omit compressions may be more useful for obtaining improved performance than the ability to omit erases.

Referring back to decision diamond 78, if the number of FTPs counted by the FTP counter is not greater than critical number 1, method 70 proceeds to decision diamond 92, meaning there is enough time to do a normal compression (assuming no FTPs during compression) or an erase to free up more NVM sectors. At decision diamond 92 it is determined if compression is needed (as was already described above in reference to decision diamond 80). If compression is not needed, method proceeds to decision diamond 96 to determine if an erase is needed, and if so, to block 98. Decision diamond 96 and block 98 operate as described above in reference to decision diamond 88 and block 90, respectively.

However, if at decision diamond 92, compression is needed, method 70 proceeds to block 94 in which compression begins on the to-be-compressed sector (the oldest sector of NVM 30, which is full and has valid records). Upon beginning the compression, a compression timer, Tcp, in timers 28 is started. The Tcp timer indicates the time that is currently spent on compression on the to-be-compressed sector during the EEE write operation. The compression is aborted, though, if (1) Tcp is greater than or equal to the specification time of one EEE write operation (Tspec) minus the time to write new EEE data (Tpro) and (2) the number of ready sectors is greater than critical number 2 (which indicates that there are still enough ready sectors available for the following EEE writes). That is, if these two conditions are met, the compression is aborted. If these conditions are not both met, compression continues, and the Tcp timer continues until the compression finishes.

Note that, in one embodiment, Tspec is a static value stored in ROM 26 which indicates the maximum time specified in the specification (spec) of the EEE system for one EEE write operation, including the time for a new data write (Tpro), compression time (Tcp) or erase time (Ters), if needed. Therefore, if an EEE write operation takes longer than Tspec, the EEE write operation fails. Ters is also a static value stored in ROM 26 which indicates the time of adding one erase pulse to a to-be-erased sector during one EEE write operation. Also, Tsrec is a static value stored in ROM 26 which indicates the time zero typical time to program one single record to NVM 30. The time zero refers to the first time one single record is programmed, when the memory is fresh in its lifecycle. In some technologies, this is the longest time to program a record, in which, after numerous programs, the time to program one record becomes less. The value N and critical numbers 1 and 2 may be static values stored in ROM 26. Critical numbers 1 and 2 may also be referred to as thresholds.

Figure 4:
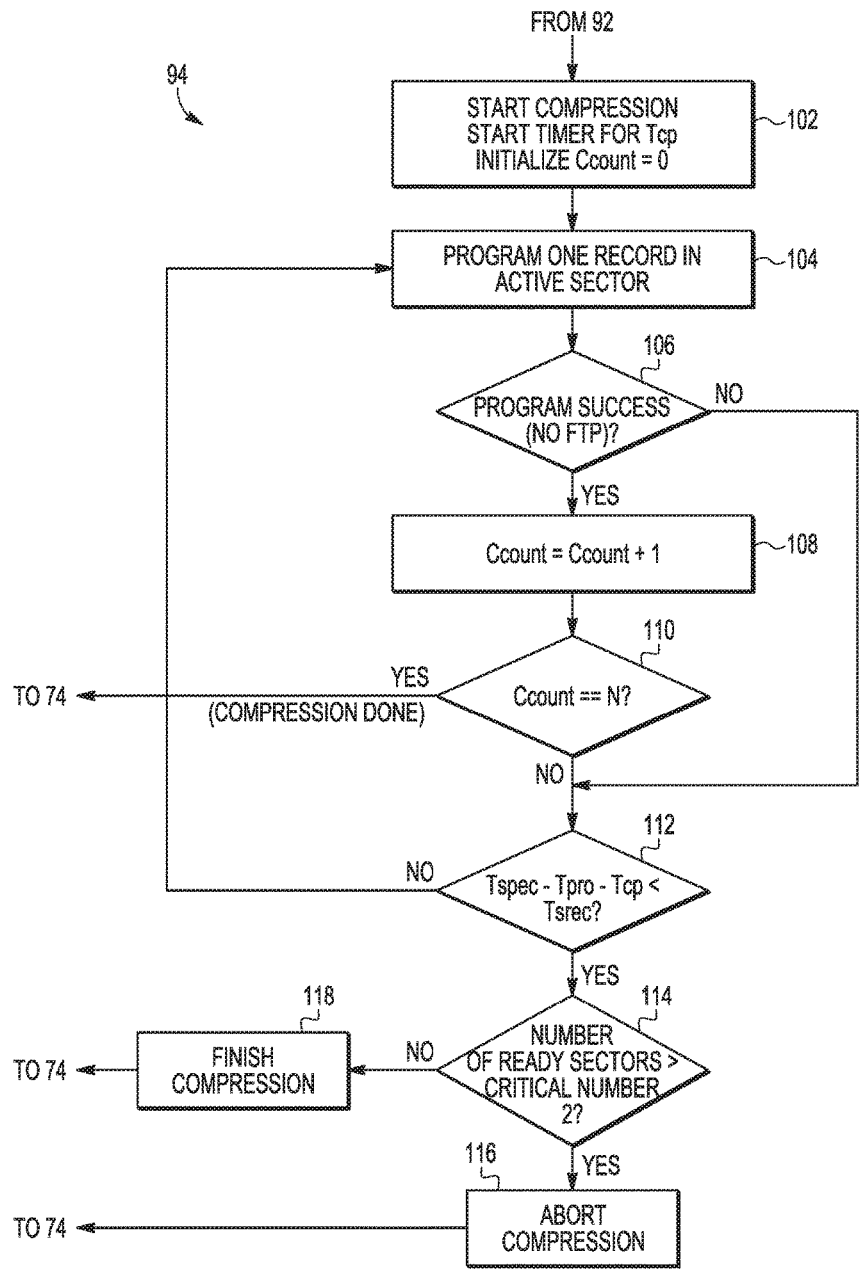

FIG. 4 illustrates one way to implement block 94 of FIG. 3. Therefore, from decision diamond 92, method 70 proceeds to block 102 of FIG. 4 in which compression is started and the Tcp timer is started. Also, Ccount is initialized to 0, in which Ccount (which may be a counter within counters 25) is a counter for the number of records that have already been compressed successfully from the to-be-compressed sector to the active sector. Then, in block 104, one record from the to-be-compressed sector is programmed into the active sector. Method 70 proceeds to decision diamond 106 in which if the programming of the record into the active sector is successful (i.e. not an FTP), Ccount is incremented by 1 at block 108. At decision diamond 110, if Ccount is equal to N (which is the number of valid records to be compressed for one compression), then compression is done and method 70 returns to block 74. However, if Ccount is not equal to N (or if the programming of the record was not successful), method 70 proceeds to decision diamond 112.

At this point, beginning with decision diamond 112, compressing continues with the next valid record from the to-be-compressed sector to the active sector so long as Tspec-Tpro-Tcp is greater than or equal to Tsrec. If Tspec-Tpro-Tcp (indicating the time left for a EEE write to remain within Tspec, after performing the programming of the record in block 76 and performing the compression thus far) is less than Tsrec (a typical time required to program a single record, such as the time zero required to program a single record), there is not enough time for programming one more record in the active sector within Tspec and compression is aborted. Therefore, at decision diamond 112, it is determined of Tspec-Tpro-Tcp is less than Tsrec. If not, compression continues with block 104. However, if Tspec-Tpro-Tcp is less than Tsrec, method 70 proceeds with decision diamond 114 in which it is determined if the number of ready sectors is greater than critical number 2. If not, compression is forced to finish at block 118 and not aborted because NVM 30 is running out of space (presenting a ready sector emergency). However, if the number of ready sectors is greater than critical number 2, the compression that was commenced in block 102 is aborted, after which method 70 returns to block 74. Note that, in the implementation of FIG. 4, aborting compression only occurs after finishing writing one record into NVM 30 during compression. In this manner, compression is not aborted in the middle of programming one record, which results in wasting one address during compression.

The operations of FIGS. 3 and 4 can be performed using circuitry in memory controller 22 and sector management circuitry 24. For example, memory controller 22 and sector management circuitry 24 control operations such as the EEE writes, dynamic compression, compression aborts, and erases. Note that determining critical number 1 and critical number 2 can affect how well method 70 operates to improve EEE writes. In one embodiment, critical number 1 is set to 2. Critical number 1 is determined by the specification expectation/requirement of one EEE write and post-silicon characterization. For example, if four FTPs during a new data write and one normal compression (without FTP during the compression) or erase cause a EEE write to go out of spec, or take more time than expected, critical number 1 should be set to 3 rather than 2. In one embodiment, critical number 2 is set to 2 and is determined by doing analysis and simulation. For example, if the number of ready sectors is not greater than a certain number, it might cause the EEE system to run out of available space soon. Therefore that certain number is set as critical number 2. In an extreme case, critical number 2 is set to 0, which means that if there is already no ready sector left, a compression must be done to free up new NVM space, otherwise, the EEE system will run out of space soon.

One implementation for making comparisons with critical number 1 and critical number 2 for the dynamic compression scheme described above may include using two decision signals as a result of comparisons of critical number 1 and critical number 2 via comparators 27, where $$decision1 = \begin{cases} 0, & \text{number of } FTP's \leq PN1 \\ 1, & \text{number of } FTP's > PN1 \end{cases}$$

and $$decision2 = \begin{cases} 0, & \text{erase count} \leq PN2 \\ 1, & \text{erase count} > PN2 \end{cases}.$$

Digital timers can be designed for Tpro and Tcp.

Therefore, by now it can be appreciated how dynamic compression can be used to improve performance of a EEE system by reducing failures. With dynamic compression, even if compression is determined to be needed, compression may or may not occur, as determined dynamically by different factors. In one embodiment, if the number of FTPs, as provided by an FTP count, is greater than critical number 1 then compression can be selectively omitted based on the number of ready sectors. For example, if the number of ready sectors is greater than critical number 2, then compression is omitted. Also, if the FTP count is not greater than critical number 1, a compression can be aborted under certain conditions. By omitting or aborting compressions, when possible, the number of failures can be reduced, thereby improving performance and extending product lifetime. Also, in either situation, the determination of whether or not a compression is needed (whether completed, omitted, or aborted) is performed after successfully programming a new record in the active sector. In this manner, the new EEE write data is not lost.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary data processing system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of system 10 are circuitry located on a single integrated circuit or within a same device. Alternatively, system 10 may include any number of separate integrated circuits or separate devices interconnected with each other. For example, any one or more of other modules 18 may be located on a same integrated circuit as processor 12 or on a separate integrated circuit or located within another peripheral or slave discretely separate from other elements of system 10.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different types of storage circuitry can be used to store the static or dynamic values described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, in an electrically erasable programmable read only memory (EEPROM) emulation (EEE) system having a non-volatile memory arranged to have a plurality of sectors in which each sector is arranged to have a plurality of record locations, a method includes programming a new record of new data into a record location of an active sector of the plurality of sectors; after successfully completing the programming of the new record, comparing a number of failure-to-program (FTP) occurrences during the programming to a first threshold; when the number of FTP occurrences is greater than the first threshold: determining that compression is needed, and in response to determining that compression is needed, selectively performing compression based on a second threshold. In one aspect, the method further includes when the number of FTP occurrences is less than the first threshold: determining that compression is needed, in response to determining that compression is needed, commencing compression, and during the compression, aborting the compression prior to completing the compression. In a further aspect, determining that compression is needed comprises determining that an oldest full sector of the plurality of sectors includes at least one valid record. In another further aspect, the aborting the compression is performed in response to determining that: a time left for a EEE write to remain within a specification time of one EEE write operation after performing the programming of the new record and after performing an initial part of the compression since the compression commenced is less than a typical time required for writing a single record, and a number of sectors of the plurality of sectors which are ready to store new records is greater than a second threshold. In an even further aspect, the aborting the compression is performed after programming a first valid record from the oldest full sector to the active sector. In an even further aspect, a complete compression operation includes programming a predetermined number of valid records from the oldest full sector to the active sector, and the aborting the compression is performed after programming the first valid record to the active sector but prior to programming the predetermined number of valid records to the active sector. In another further aspect, when the number of FTP occurrences is less than the first threshold, the method further includes performing an erase operation of one sector of the plurality of sectors. In another aspect of the above one embodiment, the selectively performing compression based on a second threshold includes performing compression if a number of sectors of the plurality of sectors which are ready to store new records is not greater than the second threshold, and omitting compression if the number of sectors of the plurality of sectors which are ready to store new records is greater than the second threshold. In a further aspect, determining that compression is needed includes determining that an oldest full sector of the plurality of sectors includes at least one valid record. In another aspect, when the number of FTP occurrences is greater than the first threshold, the method further includes performing an erase operation of one sector of the plurality of sectors.

In another embodiment, an electrically erasable programmable read only memory (EEPROM) emulation (EEE) system includes a non-volatile memory (NVM) arranged to have a plurality of sectors in which each sector is arranged to have a plurality of record locations; a memory controller coupled to the NVM and having a failure-to-program (FTP) counter configured to count FTP occurrences, a program duration timer, and a compression duration timer, and storage circuitry configured to store a first threshold and a second threshold, the memory controller configured to: program a new record of new data into a record location of an active sector of the plurality of sectors while enabling the program duration counter, and after successfully completing the programming of the new record and stopping the program duration counter, compare a count value by the FTP counter to the first threshold, wherein, when the count value is greater than the first threshold, in response to determining that compression is needed, selectively perform compression based on the second threshold. In one aspect, the memory controller is configured to determine that compression is needed by determining that an oldest full sector of the plurality of sectors includes at least one valid record. In another aspect, the memory controller is configured to: when the count value is less than the first threshold, in response to determining that compression is needed, commence compression while enabling the compression duration counter, and during the compression, abort the compression prior to completing the compression. In a further aspect, the memory controller is configured to abort the compression when a time left for a EEE write to remain within a specification time of one EEE write operation minus the program duration counter and minus the compression duration counter is less than a typical time required for writing a single record, and a number of sectors of the plurality of sectors which are ready to store new records is greater than the second threshold. In another aspect, the memory controller is configured to, when the counter value is greater than the first threshold and in response to determining that compression is needed, perform compression if a number of sectors of the plurality of sectors which are ready to store new records is not greater than the second threshold, and omit compression if the number of sectors of the plurality of sectors which are ready to store new records is greater than the second threshold.

In yet another embodiment, in an electrically erasable programmable read only memory (EEPROM) emulation (EEE) system having a non-volatile memory arranged to have a plurality of sectors in which each sector is arranged to have a plurality of record locations, a method includes programming a new record of new data into a record location of an active sector of the plurality of sectors; after successfully completing the programming of the new record, comparing a number of failure-to-program (FTP) occurrences during the programming to a first threshold; when the number of FTP occurrences is greater than the first threshold: in response to determining that compression is needed, performing compression if a number of sectors of the plurality of sectors which are ready to store new records is not greater than a second threshold, and omitting compression if the number of sectors of the plurality of sectors which are ready to store new records is greater than the second threshold; when the number of FTP occurrences is less than the first threshold: in response to determining that compression is needed, commencing compression, and during the compression, aborting the compression prior to completing the compression. In one aspect, determining that compression is needed includes determining that an oldest full sector of the plurality of sectors includes at least one valid record. In a further aspect, the aborting the compression is performed in response to determining that: a time left for a EEE write to remain within a specification time of one EEE write operation after performing the programming of the new record and after performing an initial part of the compression since the compression commenced is less than a typical time required for writing a single record, and a number of sectors of the plurality of sectors which are ready to store new records is greater than a second threshold. In another aspect of the yet another embodiment, a complete compression operation includes programming a predetermined number of valid records from the oldest full sector to the active sector, and the aborting the compression is performed after programming a first valid record to the active sector but prior to programming the predetermined number of valid records to the active sector. In another aspect, the method further includes performing an erase of one sector of the plurality of sectors.

What is claimed is:

1. In an electrically erasable programmable read only memory (EEPROM) emulation (EEE) system having a non-volatile memory arranged to have a plurality of sectors in which each sector is arranged to have a plurality of record locations, a method comprising:
   programming a new record of new data into a record location of an active sector of the plurality of sectors;
   after successfully completing the programming of the new record, comparing a number of failure-to-program (FTP) occurrences during the programming to a first threshold;
   when the number of FTP occurrences is greater than the first threshold:
   determining that compression is needed, and
   in response to determining that compression is needed, selectively performing compression based on a second threshold.

2. The method of claim 1, further comprising:
   when the number of FTP occurrences is less than the first threshold:
   determining that compression is needed,
   in response to determining that compression is needed, commencing compression, and
   during the compression, aborting the compression prior to completing the compression.

3. The method of claim 2, wherein determining that compression is needed comprises determining that an oldest full sector of the plurality of sectors includes at least one valid record.

4. The method of claim 2, wherein the aborting the compression is performed in response to determining that:
   a time left for a EEE write to remain within a specification time of one EEE write operation after performing the programming of the new record and after performing an initial part of the compression since the compression commenced is less than a typical time required for writing a single record, and
   a number of sectors of the plurality of sectors which are ready to store new records is greater than a second threshold.

5. The method of claim 3, wherein the aborting the compression is performed after programming a first valid record from the oldest full sector to the active sector.

6. The method of claim 5, wherein a complete compression operation includes programming a predetermined number of valid records from the oldest full sector to the active sector, and the aborting the compression is performed after programming the first valid record to the active sector but prior to programming the predetermined number of valid records to the active sector.

7. The method of claim 2, wherein when the number of FTP occurrences is less than the first threshold, the method further comprising:
   performing an erase operation of one sector of the plurality of sectors.

8. The method of claim 1, wherein the selectively performing compression based on a second threshold comprises:
   performing compression if a number of sectors of the plurality of sectors which are ready to store new records is not greater than the second threshold, and
   omitting compression if the number of sectors of the plurality of sectors which are ready to store new records is greater than the second threshold.

9. The method of claim 8, wherein determining that compression is needed comprises determining that an oldest full sector of the plurality of sectors includes at least one valid record.

10. The method of claim 1, wherein when the number of FTP occurrences is greater than the first threshold, the method further comprising:
    performing an erase operation of one sector of the plurality of sectors.

11. An electrically erasable programmable read only memory (EEPROM) emulation (EEE) system, comprising:
    a non-volatile memory (NVM) arranged to have a plurality of sectors in which each sector is arranged to have a plurality of record locations;
    a memory controller coupled to the NVM and having a failure-to-program (FTP) counter configured to count FTP occurrences, a program duration timer, and a compression duration timer, and storage circuitry configured to store a first threshold and a second threshold, the memory controller configured to:
    program a new record of new data into a record location of an active sector of the plurality of sectors while enabling the program duration counter, and after successfully completing the programming of the new record and stopping the program duration counter, compare a count value by the FTP counter to the first threshold, wherein, when the count value is greater than the first threshold, in response to determining that compression is needed, selectively perform compression based on the second threshold.

12. The EEE system of claim 11, wherein the memory controller is configured to determine that compression is needed by determining that an oldest full sector of the plurality of sectors includes at least one valid record.

13. The EEE system of claim 11, wherein the memory controller is configured to:
    when the count value is less than the first threshold, in response to determining that compression is needed, commence compression while enabling the compression duration counter, and during the compression, abort the compression prior to completing the compression.

14. The EEE system of claim 13, wherein the memory controller is configured to abort the compression when a time left for a EEE write to remain within a specification time of one EEE write operation minus the program duration counter and minus the compression duration counter is less than a typical time required for writing a single record, and a number of sectors of the plurality of sectors which are ready to store new records is greater than the second threshold.

15. The EEE system of claim 11, wherein the memory controller is configured to, when the counter value is greater than the first threshold and in response to determining that compression is needed, perform compression if a number of sectors of the plurality of sectors which are ready to store new records is not greater than the second threshold, and omit compression if the number of sectors of the plurality of sectors which are ready to store new records is greater than the second threshold.

16. In an electrically erasable programmable read only memory (EEPROM) emulation (EEE) system having a non-volatile memory arranged to have a plurality of sectors in which each sector is arranged to have a plurality of record locations, a method comprising:
    programming a new record of new data into a record location of an active sector of the plurality of sectors;
    after successfully completing the programming of the new record, comparing a number of failure-to-program (FTP) occurrences during the programming to a first threshold;
    when the number of FTP occurrences is greater than the first threshold:
        in response to determining that compression is needed, performing compression if a number of sectors of the plurality of sectors which are ready to store new records is not greater than a second threshold, and omitting compression if the number of sectors of the plurality of sectors which are ready to store new records is greater than the second threshold;
    when the number of FTP occurrences is less than the first threshold:
        in response to determining that compression is needed, commencing compression, and during the compression, aborting the compression prior to completing the compression.

17. The method of claim 16, wherein determining that compression is needed comprises determining that an oldest full sector of the plurality of sectors includes at least one valid record.

18. The method of claim 17, wherein the aborting the compression is performed in response to determining that:
    a time left for a EEE write to remain within a specification time of one EEE write operation after performing the programming of the new record and after performing an initial part of the compression since the compression commenced is less than a typical time required for writing a single record, and
    a number of sectors of the plurality of sectors which are ready to store new records is greater than a second threshold.

19. The method of claim 16, wherein a complete compression operation includes programming a predetermined number of valid records from the oldest full sector to the active sector, and the aborting the compression is performed after programming a first valid record to the active sector but prior to programming the predetermined number of valid records to the active sector.

20. The method of claim 16, further comprising:
    performing an erase of one sector of the plurality of sectors.

* * * * *